(12) United States Patent
Böldl

(10) Patent No.: US 6,775,648 B1
(45) Date of Patent: Aug. 10, 2004

(54) DICTATION AND TRANSCRIPTION APPARATUS

(75) Inventor: Herbert Böldl, Vienna (AT)

(73) Assignee: Koninklijke Philips Electronics N.V., Eindhoven (NL)

( * ) Notice: Subject to any disclaimer, the term of this patent is extended or adjusted under 35 U.S.C. 154(b) by 991 days.

(21) Appl. No.: 08/802,828

(22) Filed: Feb. 19, 1997

(30) Foreign Application Priority Data

Mar. 8, 1996 (EP) .............................. 96200636

(51) Int. Cl.[7] ............................................ G10L 21/00
(52) U.S. Cl. ...................................................... 704/201
(58) Field of Search ....................... 369/25–27; 704/201,
704/270, 272, 275, 278, 200, 212, 211,
254, 266

(56) References Cited

U.S. PATENT DOCUMENTS

| | | | | |
|---|---|---|---|---|
| 3,723,667 A | * | 3/1973 | Park, Jr. et al. ............. | 704/254 |
| 4,053,840 A | * | 10/1977 | Baron ......................... | 704/200 |
| 4,384,170 A | * | 5/1983 | Mozer et al. ................ | 704/266 |
| 4,468,751 A | * | 8/1984 | Plunkett, Jr. ................. | 369/27 |
| 4,588,857 A | * | 5/1986 | Arsem ........................ | 704/275 |
| 4,791,660 A | * | 12/1988 | Oye et al. .................... | 704/212 |
| 5,347,478 A | * | 9/1994 | Suzuki et al. ................ | 704/211 |
| 5,481,645 A | | 1/1996 | Bertino et al. .............. | 704/270 |
| 5,495,552 A | * | 2/1996 | Sugiyama et al. ........... | 704/201 |
| 5,602,963 A | * | 2/1997 | Bissonnette et al. ........ | 704/270 |
| 5,630,010 A | * | 5/1997 | Sugiyama et al. ........... | 704/201 |

FOREIGN PATENT DOCUMENTS

| | | | | |
|---|---|---|---|---|
| EP | 0065148 B1 | 11/1982 | ........... | G06F/15/20 |
| EP | 0536792 | 4/1993 | .......... | G06K/19/07 |

OTHER PUBLICATIONS

Computer Dictionary, 2nd Edition, Microsoft Press, 1994, pp. 294–295.*
Sony Product advertisement, ICD–50. Digital Micro Recorders, 1995, www.sel.sony.com/, 1 page.*
SYCOM™ Product advertisement, The New York Times, Aug. 17, 1997, Classic Digital Voice Recorder/Organizer, 1 page.*
Voice IT product advertisements, 6 types of voice recorder/organizers www.voiceit.com, 9 pages, Aug. 27, 1998.*

* cited by examiner

Primary Examiner—David D. Knepper
(74) Attorney, Agent, or Firm—John Vodopia

(57) ABSTRACT

A dictation apparatus is disclosed for storing a speech signal in a memory. The dictation apparatus includes a data compression unit for compressing the speech signal and a storing unit for storing the data compressed speech signal in the memory. The data compression unit performs the data compression on the speech signal in one of at least two different selectable data compression modes. The data compression unit also creates data files including portions of the data compressed speech signal and a header portion including an identifier signal identifying the data compression mode selected. For realizing an insert, a control unit is included that is selectively operable by a user for providing an insert signal and an end of insert signal. In response to the occurrence of each insert signal, a block of at least two and at most three pointing vectors is generated. The block of pointing vectors include a first address signal corresponding to the address where the dictation insert should be placed and a second address signal corresponding to a beginning address of an available portion of said addressable memory for storing the dictation insert.

16 Claims, 5 Drawing Sheets

DICTATION AND TRANSCRIPTION APPARATUS

BACKGROUND OF THE INVENTION

The invention relates to a dictation apparatus for storing a speech signal in addressable memory means and to a transcription apparatus for transcribing speech messages. A dictation apparatus as defined in the opening paragraph is well known in the art. Reference is made in this respect to EP-A 65,148, document (4) in the list of related documents.

Data compression may be realized in prior art dictation apparatuses by discarding the silence periods normally present in the speech signal. Further, one may store an indication signal indicating the length of the silence period and its location in the speech signal. Upon transcription, a replica of the speech signal can be regenerated by inserting silence periods of the same length at the indicated positions in the compressed speech signal.

Sometimes an insert need to be added to a speech signal stored earlier in the memory means. EP-A 65,148 describes a way how to enable an insert to be stored in the memory means.

SUMMARY OF THE INVENTION

The invention aims at providing an improved dictation apparatus. The dictation apparatus in accordance with the invention is characterized in that the device comprising input means for receiving the speech signal, data compression means for data compressing the speech signal into a data compressed speech signal, the data compression means being adapted to carry out a data compression step on the speech signal in one of at least two different data compression modes, the at least two different data compression modes resulting in different data compression ratios when applied to the same speech signal, the said at least two different data compression modes being selectable by a user, the data compression means being further adapted to create data files comprising a data compressed speech signal, the data files comprising a header portion, the data compression means being also adapted to generate an identifier signal identifying the data compression mode selected and being adapted to store said identifier signal in said header portion, storing means for storing the data files in the memory means, the storing means comprising address generator means for generating addresses for said addressable memory means, for storing blocks of information comprised in a data file in the memory means, control means selectively operable by a user for providing an insert signal and an end of insert signal, pointing vector generator means for generating a block of at least two and at most three pointing vectors in response to the occurrence of each insert signal, said block of pointing vectors comprising a first address signal corresponding to the address generated by the address generator means upon the occurrence of the insert signal and a second address signal corresponding to a beginning address of an available portion of said addressable memory for storing a dictation insert.

The invention is based on the following recognition. The memory capacity of memories included in dictation apparatuses is limited. Preferably, an increased number of dictations should be stored in a memory. This has been realized in the prior art by leaving out the silence periods present in a speech signal. A larger compression ratio can be obtained by applying more powerful compression techniques. More specifically, lossy compression techniques result in large data compression ratios. Larger data reduction ratios, however, may lead to a decrease in quality of the retrieved signal upon data expansion. In accordance with the invention, a dictation system has been proposed in which the user has the possibility to choose one data compression mode from two or more data compression modes in which the dictation apparatus can compress the speech signal. The user can make a trade off between the number of speech messages that he wants to dictate and store in one memory unit and the quality of the speech signal upon reproduction. If the user wants to have more dictations stored in the memory, he will select the data compression mode giving a higher data compression ratio. If the user prefers a higher quality of reproduction, he will choose the data compression mode giving a lower data compression ratio.

Further, storing an insert in the memory means is realized by storing two, or in another embodiment, three pointing vectors at the maximum for each insert to be stored in the memory means. This has an advantage over the prior art dictation apparatus, which requires the storage of a jump signal at the location in the originally stored speech signal where the insert should be made, thereby overwriting a portion of the original speech signal stored, a jump signal at the end of the stored insert and four pointing vectors linking the two addresses from which a jump should take place to the two addresses where the jumps should end.

Contrary to this, in one embodiment of the invention, only two pointing vectors are required, linking the address in the originally stored speech signal where the insert should be made and the address corresponding to a beginning address of an available portion of said addressable memory for storing a dictation insert. At the end of the insert, an end-of-file signal could bestored, which can be used as jump instruction upon reproduction so as to jump back to the position of the insert in the original speech message.

In another embodiment, exactly three pointing vectors are stored in a block of pointing vectors, the third address signal corresponding to the address generated by the address generator means upon the occurrence of the end of insert signal. Upon reproduction in the transcription apparatus, the addresses generated by the address generator means are compared to the first address signal so as to activate the first jump from the location of the insert in the originally stored speech signal, which corresponds to this first address signal, towards the location where the beginning of the insert is stored, which corresponds to the second address signal, upon equality of the generated addresses with the first address signal. The addresses generated by the address generator means are further compared to the third address signal so as to activate a second jump from the location where the end of the insert is stored, which corresponds to the third address signal, towards the location of the insert in the originally stored speech signal, which corresponds to the address subsequent to the first address, upon equality of the generated addresses with the third address signal.

The various subclaims define preferred embodiments of the dictation apparatus and the transcription apparatus in accordance with the invention.

BRIEF DESCRIPTION OF THE DRAWINGS

These and other aspects of the invention will be apparent from and elucidated further with reference to the embodiments described in the following figure description, in which.

DETAILED DESCRIPTION OF THE PREFERRED EMBODIMENTS

Figure 1:
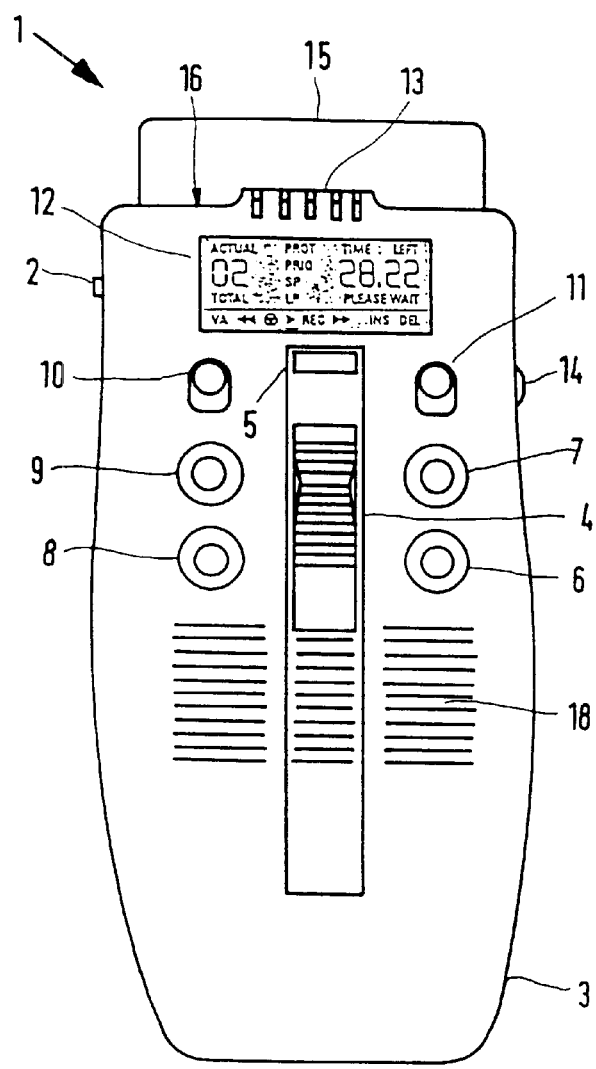
FIG. 1 shows an embodiment of the dictation apparatus, which is in hand held form.

FIG. 1 shows a front view of a dictation apparatus in accordance with the invention, which is in this example in hand held form. The apparatus 1 provided with an on/off switch 2 located on the side of the housing of the apparatus. At the bottom of the housing a battery compartment 3 (not shown) is provided that can be reached at the back of the housing. A sliding switch 4 is provided on the front face of the housing for switching the apparatus in the various dictation modes. The apparatus is provided with a number of buttons: button 5 is the record button, button 6 is the LETTER button, button 7 is the MODE button, button 8 is the INSERT button and button 9 is the DELETE button. The switch 10 is the recording mode switch. The switch 11 is the sensitivity switch. The apparatus 1 is further provided with a LCD display for displaying various information regarding a dictation, such as the recording time of the dictation, the recording time left, the recording mode, the number of dictations, etc.

A microphone 13 and a loudspeaker 18 are provided in the housing and a volume control knob 14 is provided on the side of the housing. Further, a slot 16 is provided in the top face of the device for receiving a memory card 15.

Figure 2:
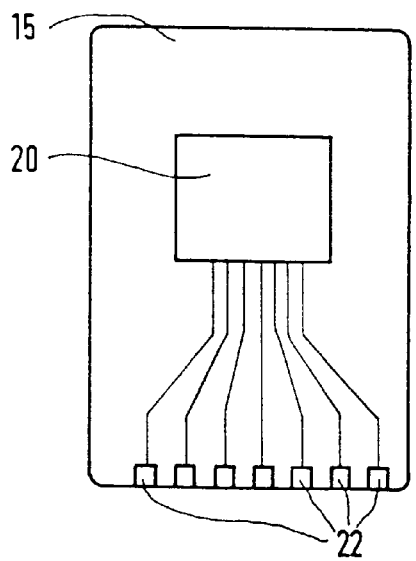
FIG. 2 shows an embodiment of the memory card for use in an embodiment of a dictation apparatus, provided with such a removable memory card.

The memory card 15 is also shown in FIG. 2. The memory card 15 is provided with a solid state memory 20 and with electrical terminals 22 connected to the solid state memory 20. The solid state memory 20 can eg. be an EEPROM or a flash erasable memory. The electrical terminals 22 can be such that they enable an electrical cooperation with the internationally standardized PCMCIA interface of a PC.

Figure 3:
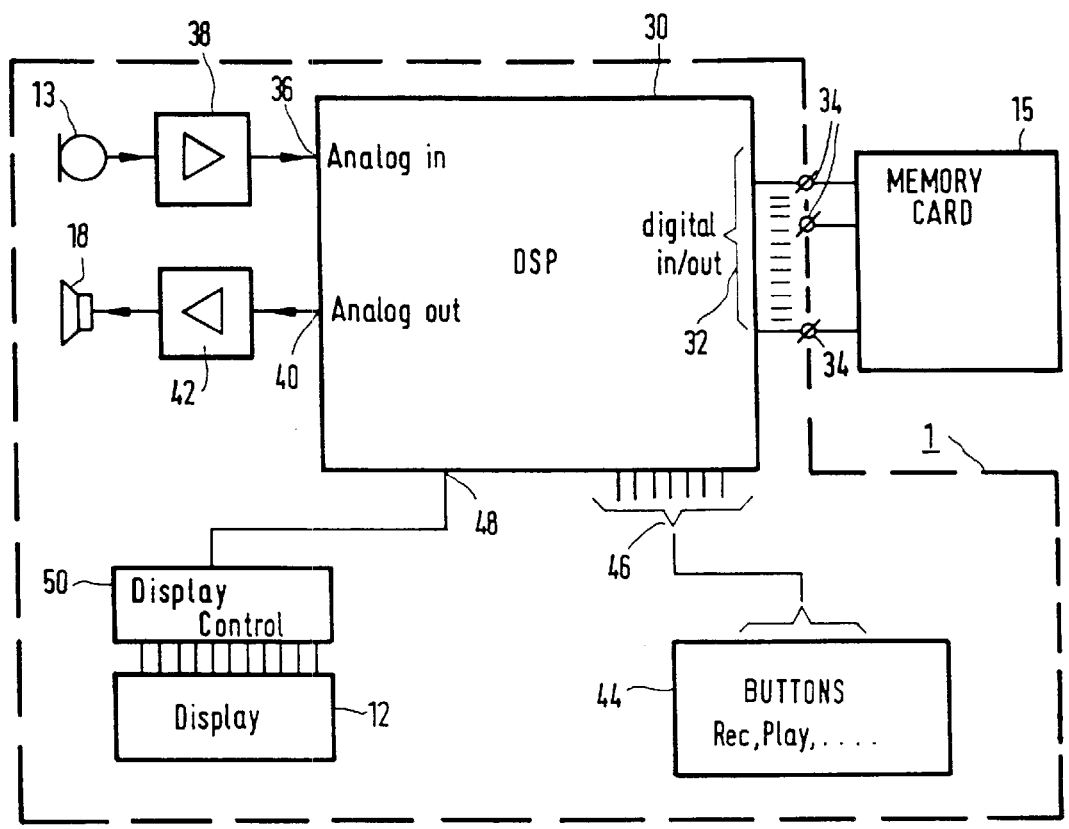
FIG. 3 shows the circuit diagram in the dictation apparatus.

FIG. 3 shows the electrical construction of the apparatus 1 and its cooperation with the memory card 15. The apparatus 1 comprises a digital signal processor 30, having a digital input/output 32 coupled to terminals 34 that are electrically coupled to the terminals 22 of the memory card 15, when positioned in the slot 16. The microphone 13 is coupled to an analog input 36 of the processor 30, if required via an amplifier 38. The processor 30 further comprises an analog output 40 which is coupled to the loudspeaker 18 via an amplifier 42. The various knobs and buttons, denoted in FIG. 3 by the reference numeral 44 are coupled to control inputs 46 of the processor 30. Further, a control output 48 of the processor 30 is coupled to a display control unit 50 for controlling the display of information on the display 12.

The user places the memory card 15 into the slot 16 of the apparatus 1 until the terminals 22 of the memory card 15 come into contact with electrical terminals 34 provided in the slot of the device 1. The memory card is now in electrical and mechanical contact with the apparatus 1.

The processor 30 is capable of receiving the analog speech signals via the input 36 and to A/D convert the speech signal into a digital speech signal. Further, upon selection by the user, the processor 30 is capable of carrying out one of at least two different data compression steps on the digital speech signal. Suppose, the processor 30 is capable of carrying out two data compression steps on the speech signal. Each compression step carried out on the same speech signal results in different compression ratios. The data compression steps can be in the form of lossless compression steps. This means that no data is actually lost and the original speech signal can be fully recovered upon data expansion. One example of a lossless data compression method is linear predictive coding followed by a Huffman encoding carried out on the output signal of the linear predictive coder. Data compression can also be lossy. One such lossy data compression step is subband coding, well known in the art and applied in DCC digital magnetic recording systems. In lossy compression methods, part of the information that is unaudible is actually thrown away. Upon data expansion, a replica of the original speech signal is recovered. As the information that is left out upon data compression was unaudible, the replica of the speech signal will be heard by the user as being the same as the original speech signal.

The processor 30 may be capable of carrying out a lossless data compression step on the speech signal and a lossy data compression step, as the two different data compression steps that can be realized by the processor 30. As an alternative, the processor 30 can carry out two different lossless data compression steps resulting in different data compression ratios. As again another alternative, the processor 30 may be capable of carrying out two different lossless data compression steps on the speech signal, resulting in two different data compression ratios. As an example of the last possibility: the processor 30 could be provided with a simple subband encoder as applied in DCC. The subband encoder can be simple as less subbands are required for encoding the speech signal. Less subbands are required, eg. 5 instead of the 32 in the DCC subband encoder, as the bandwidth of the speech signal is much smaller than a wideband audio signal. Different compression ratios can be obtained with the simplified subband encoder by changing the bitpool for the bitallocation step in the simplified subband encoder. Reference is made in this respect to the documents (1), (2), (3a) and (3b) in the list of documents that can be found at the end of this description.

When the user wants to record a speech message into the device, he depresses the LETTER button 6, which indicates that the user wants to store a speech message. Further, the user can actuate the MODE button 7 in order to select various modes, such as whether the speech message should have a (high) priority, or whether the speech message should be protected from overwriting. Subsequently the user selects a recording mode by actuating the button 10. Selecting the recording mode means that the user selects a data compression mode. If the user wants a relatively good quality recording, he/she chooses the data compression mode resulting in the lowest data compression ratio. As a result, a larger amount of information will be stored in the memory 20 for the said dictation, so that less dictations can be stored in said memory. If the user wants as many dictations as possible being stored in the memory 20, he/she will choose the data compression mode resulting in the higher data compression ratio. A lower quality storage of the dictations may be the result.

Figure 5:
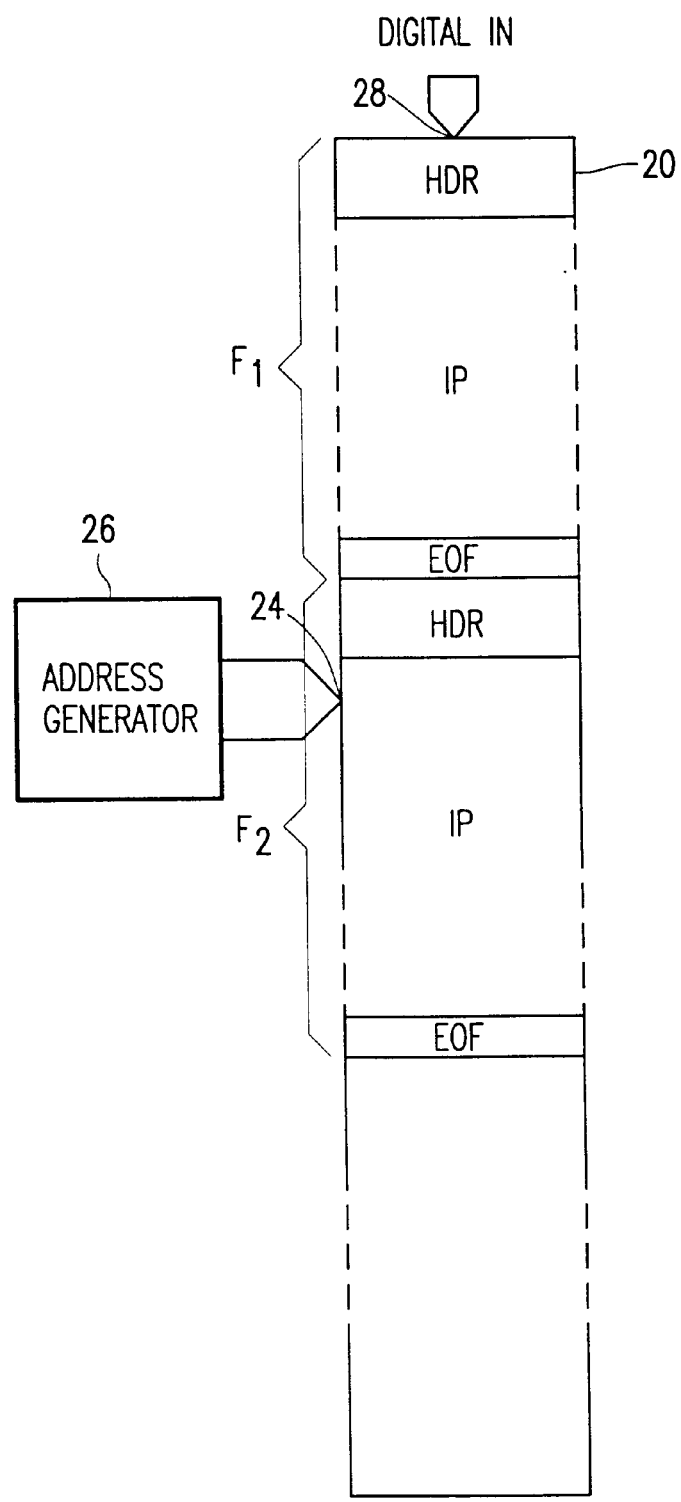
FIG. 5 shows the memory unit in which the files comprising the speech signals are stored.

The compressed information is included in blocks of information (or 'files') $F_1$, $F_2$, . . . . This is shown in FIG. 5. Each file of information F has a header portion, denoted HDR, and an information portion, denoted IP. An identifier signal is stored in the header portion. The identifier signal in a header portion HDR of a signal block identifies the compression mode applied on the speech signal in order to generate the data compressed information stored in the information portion IP of that same signal block. The sequence of signal blocks is supplied to the digital output 32 of the processor 30 and subsequently stored in the memory 20 on the memory card 15. The data portion of a file could be terminated by using an end-of-file codeword EOF.

It should be noted here, that in the present example, the processor 30 generate signal blocks as long as required to store the information of exactly one speech message in.

Storing of the data compressed speech signal into the memory 20 is realized by supplying the data compressed speech signal to an input 28 of the memory. Further an address generator 26 is present in the processor 30 to generate addresses for the memory 20. Those addresses are supplied to the memory 20 via an input 24, see the FIG. 5. Bytes of information of the data compressed speech signal are stored at subsequent storage locations in the memory 20 by supplying subsequent addresses to the memory 20 via the input 24. As said before, the file can be closed by storing an end-of-file word in the memory 20.

Figure 6:
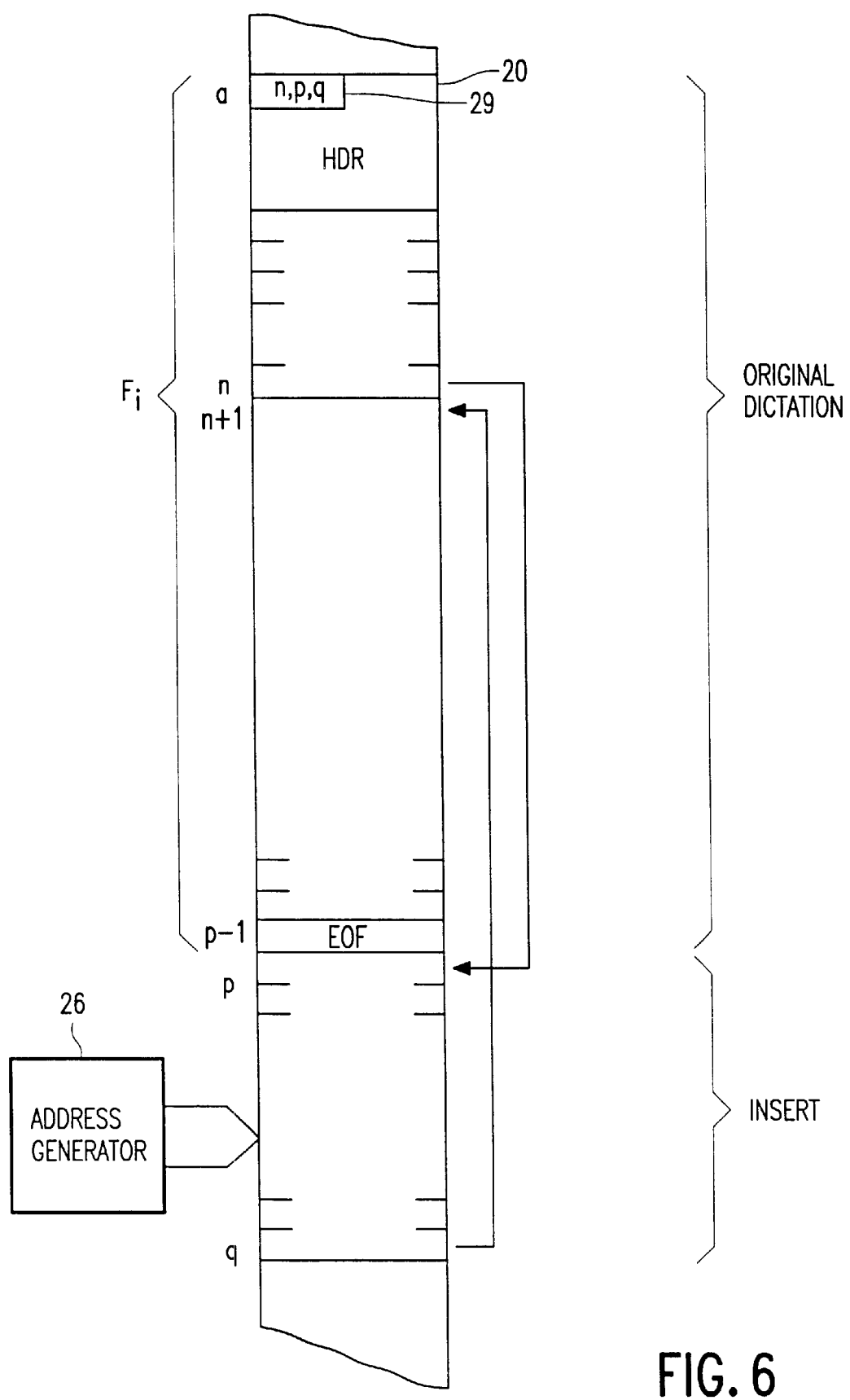
FIG. 6 shows the storage of an insert in the memory unit.

Now, it will be described how an insert can be stored in the memory. Reference is made to FIG. 6, for further explanation. Suppose the user of the dictation apparatus has stored a speech message in his/her dictation apparatus as a speech file $F_i$. Upon checking the dictation when rehearing the message, he/she considers an insert to be necessary at a certain location in the speech message. He/she presses the INSERT button 8 at the location in the stored speech message where the insert should be done. In FIG. 6, it can be seen that the insert should be added after the address n in the originally stored speech message. Upon depressing the INSERT button 8, a block 29 of pointing vectors is generated. As a first pointing vector in the block 29, the address n, where the insert should be added, is stored in the block 29. Next, the signal processor looks for an empty portion in the memory 20 where the insert can be stored. In the example of FIG. 6, this empty portion is directly behind the file $F_i$ and starts at the address p. As a second pointing vector in the block 29, the address p, where the beginning of the insert will be stored, is added to the block 29. Next, the signal processor 30 stores the insert in the memory 20. Upon the termination of the storage of the insert in the memory 20, the insert is stored in the memory locations starting with the address p, until the address q. As a third pointing vector in the block 29, the address q, where the end of the insert is be stored, is added to the block 29. Next, the signal processor 30 stores the block of three pointing vectors in the header portion HDR of the file $F_i$, see FIG. 6.

Especially in a situation where the memory 20 is removable from the dictation apparatus, the block of pointing vectors should be stored in the memory 20 itself. It may however be possible to store the block of pointing vectors in another location in the memory 20 than in the file header of the file itself. One could imagine a table of contents for all the files in the memory being stored in the memory 20, and that the block of pointing vectors is stored in this table of contents. In another embodiment, the block of pointing vectors could have been stored in a memory location in the dictation apparatus which is separate from the memory 20 in which the files are stored.

Further, in another embodiment, the storage of the insert in the memory 20 could have been terminated by storing an end-of-file word at the end of the stored insert. In this situation, there is no real need for storing the third address in the block of pointing vectors, as will be made clear later.

Figure 4:
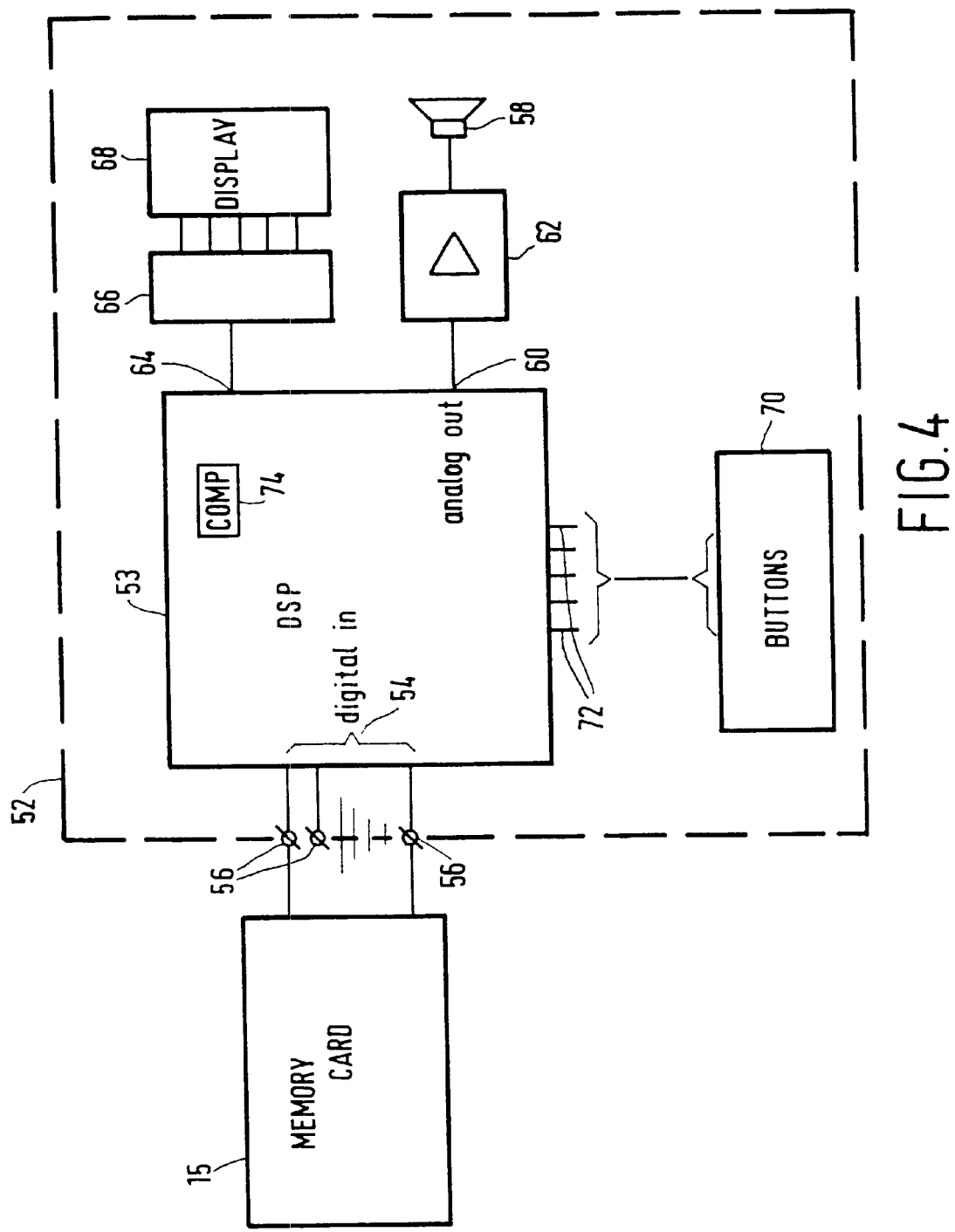
FIG. 4 shows an embodiment of a transcription apparatus, either in table top, or in PC form.

If the user wants to hear the speech message stored in the memory 20, the processor 30 is capable of retrieving the data compressed information from the memory 20 and carry out a data expansion step on the data compressed information stored in the memory. It will be clear that the data expansion step will be the inverse of the data compression step carried out during dictation. The data expansion step to be carried out in the processor 30 will be further explained hereafter, with respect to an embodiment of a transcription apparatus, as shown in FIG. 4. After having obtained a replica of the speech signal, this speech signal is D/A converted in the processor and supplied to the output 40, for reproduction by the loudspeaker 18.

For transcription of the speech messages stored in the memory 20 on the memory card 15, the memory card 15 is withdrawn from the device 1 and inserted in a table top transcription apparatus 52, see FIG. 4. The transcription apparatus 52 comprises a digital signal processor 53, having a digital input 54 coupled to terminals 56 that are electrically coupled to the terminals 22 of the memory card 15, when positioned in a slot (not shown) provided in the apparatus 52. A loudspeaker 58 is coupled to an analog output 60 of the processor 53, via an amplifier 62. The processor 53 further comprises a control output 64 which is coupled to a display control unit 66 for controlling the display of information on a display 68. A keyboard 70 is coupled to control inputs 72 of the processor 53.

The user places the memory card 15 into the slot (not shown) of the transcription apparatus 52 until the terminals 22 of the memory card 15 come into contact with electrical terminals 56 provided in the slot of the transcription apparatus 52. The memory card is now in electrical and mechanical contact with the apparatus 52.

Upon actuating a 'RETRIEVE' button on the keyboard 70, the information stored in the memory 20 on the memory card 15 is read out and stored in an internal memory of the digital signal processor 53. The processor 53 is capable of carrying out one of at least two different data expansion steps on the digital information retrieved from the memory card. It will be clear that the expansion mode carried out in the processor 53 is the inverse of the compression mode carried out during the dictation step in the processor 30. The processor 53 retrieves the identifier signal from the header portions HDR of the signal blocks and carries out a data expansion step in response to the identifier signal. As a result, a replica of the digital speech signal is obtained.

The processor 53 is further capable of D/A converting the replica of the digital speech signal into an analog speech signal and to supply the analog speech signal via the output 60 to the loudspeaker 58, so that a typist or other person can hear the speech signal that need to be transcribed.

The typist can type in the speech message reproduced via the loudspeaker using the keyboard 70, so as to obtain a typed version of the speech message.

In another embodiment of the transcription apparatus 52, when realized in the form of a personal computer, having a sufficiently large memory capacity, the apparatus may be provided with a speech recognition algorithm which enables the apparatus to generate a character file from the speech signal as a result of such speech recognition step. The character file could be made visible on the display 68, so that the typist can check for errors by reading the text on the display screen 68 and hearing the speech message via the loudspeaker 58, and correct those errors using the keyboard 70.

Previously an example of a lossless data compression method has been described, namely: linear predictive coding followed by a Huffman encoding. It will speak for itself that the processor 53 must be capable of carrying out a corresponding Huffman decoding followed by a corresponding linear predictive decoding in order to regenerate the original speech signal.

An example of a lossy data compression step has also been described, namely: subband coding. It will speak for itself that the processor 53 must be capable of carrying out a corresponding subband decoding in order to regenerate a replica of the original speech signal.

Now, the retrieval of the speech file and the insert shown in FIG. 6, will be explained.

The processor unit 53 has an address generator 26 which generates subsequent address signals for addressing subsequent storage locations in the memory 20. For retrieving the file $F_i$, the address generator 26 generates addresses starting with the address a and subsequent addresses until the address n. Upon retrieving the header portion HDR, the processor unit 53 is capable of retrieving the block of pointing vectors 29 from the header. The processor unit 53 further comprises a comparator 74, schematically shown in FIG. 4, for comparing the addresses generated by the address generator 26 with addresses stored in the block of pointing vectors. First a comparison is made with the first address n stored in the block of pointing vectors. Upon detection of equality, the comparator generates a control signal which is supplied to the address generator 26, together with the second address p in the block of pointing vectors. Upon receiving the control signal, the address generator 26 is set to the address p, and subsequently generates subsequent addresses starting from the address p. The insert can now be retrieved from the memory 20. The comparator 74 now compares the addresses generated by the generator 26 with the third address q stored in the block of pointing vectors. Upon detection of equality, the comparator generates another control signal which is supplied to the address generator 26. Upon receiving the control signal, the address generator 26 is set to the address n+1, and subsequently generates subsequent addresses starting from the address n+1. The remaining portion of the speech message can now be retrieved from the memory 20.

In another embodiment, the end of the insert is detectable because of an end-of-file word which is stored as the last word at the location of the address q. Now, a block of pointing vectors can comprise two addresses only. Upon detection of the end-of-file word at the location q in the memory, the address generator 26 is set to the address n+1, and subsequently generates subsequent addresses starting from the address n+1. The remaining portion of the speech message can now be retrieved from the memory 20.

Whilst the present invention has been described with respect to preferred embodiments thereof, it is to be understood that these are not limitative examples. Thus, various modifications may become apparent to those skilled in the art, without departing from the scope of the invention, as defined by the claims. Further, the invention lies in each and every novel feature or combination of features as herein disclosed.

Related Documents
(1) EP-A 402,973 (PHN 13.241).
(2) EP-A 400.755 (PHQ 89.018A).
(3a) EP-A 457,390 (PHN 13.328).
(3b) EP-A 457,391 (PHN 13.329).
(4) EP-A 65,148.

What is claimed is:

1. A dictation apparatus for storing a speech signal in addressable memory means, the device comprising
input means for receiving the speech signal,
data compression means for data compressing the speech signal into a data compressed speech signal, the data compression means being adapted to carry out a data compression step on the speech signal in one of at least two different data compression modes, the at least two different data compression modes resulting in different data compression ratios when applied to the same speech signal, the said at least two different data compression modes being selectable by a user, the data compression means being further adapted to create data files comprising a data compressed speech signal, the data files comprising a header portion, the data compression means being also adapted to generate an identifier signal identifying the data compression mode selected and being adapted to store said identifier signal in said header portion,
storing means for storing the data files in the memory means, the storing means comprising address generator means for generating addresses for said addressable memory means, for storing blocks of information comprised in a data file in the memory means,
control means selectively operable by a user for providing an insert signal and an end of insert signal,
pointing vector generator means for generating a block of pointing vectors in response to the occurrence of each insert signal, said block of pointing vectors comprising a first address signal corresponding to an address of where a dictation insert should be placed in the data file and a second address signal corresponding to a beginning address of an available portion of said addressable memory for storing the dictation insert.

2. Dictation apparatus as claimed in claim 1, wherein said pointing vector generator means for generating a block of pointing vectors is adapted to generate a block of exactly three pointing vectors in response to the occurrence of said insert signal, and that said block of pointing vectors further comprises a third address signal corresponding to the address generated by the address generator means upon the occurrence of the end of insert signal.

3. Dictation apparatus as claimed in claim 1, wherein the storing means are adapted to store the block of pointing vectors in the header portion of a data file.

4. Dictation apparatus as claimed in claim 1, wherein the memory means comprise a removable solid state memory unit for storing the data files, the solid state memory unit being provided with coupling means for mechanically and electrically coupling the memory unit to the hand held dictation device.

5. Dictation apparatus as claimed in claim 4, wherein the coupling means are further adapted to mechanically and electrically couple the memory unit to a PC.

6. Dictation apparatus as claimed in claim 5, wherein the coupling means are adapted to mechanically and electrically couple the memory unit to an internationally standardized interface of the PC.

7. Dictation apparatus as claimed in claim 6, wherein said interface is a PCMCIA interface.

8. Dictation apparatus as claimed in claim 4, wherein the solid state memory unit comprise an EEPROM.

9. Dictation apparatus as claimed in claim 4, wherein the solid state memory unit comprise a Flash erasable memory unit.

10. Dictation apparatus as claimed in claim 4, wherein the solid state memory unit comprise a back-up battery.

11. Dictation apparatus as claimed in claim 1, wherein the data compression means are adapted to carry out a data compression step on the speech signal in one of at least two different data compression modes, at least one of the said at least two different data compression modes being a lossy data compression mode.

12. Transcription apparatus for transcribing speech messages, wherein it comprises data expansion means adapted to carry out a data expansion step on a data compressed speech signal stored in addressable memory means, the said data compressed speech signal being data compressed in one of at least two different data compression modes, the at least two different data compression modes resulting in different data compression ratios when applied to the same speech signal, the data compressed speech signal being stored in the memory means in data files comprising the data compressed speech signal, the data files comprising a header portion in which an identifier signal is stored and a block of at least two and at most three pointing vectors may be stored, the identifier signal identifying the data compression mode selected during data compressing the speech signal, the data expansion means being adapted to retrieve the identifier signal from header portions and being adapted to carry out one of at least two different expansion modes on the data compressed information stored in the files in response to the identifier signal so as to obtain a replica of the speech signal, control means selectively operable by a user for providing a playback signal, retrieval means for retrieving the data files from the memory means, the retrieval means comprising address generator means for generating address signals for said addressable memory means, for retrieving blocks of information comprised in a data file stored in the memory means, and for retrieving a block of pointing vectors including a first address signal corresponding to an address of where a dictation insert should have been placed in a data file and a second address signal corresponding to an address of an available portion of memory for storing the dictation insert, the address generator means being adapted to generate a sequence of address signals in response to the occurrence of a playback signal, comparator means for comparing the sequence of address signals generated by the address generator means with the first address signal and for generating a jump control signal upon detection of equality between an address signal supplied by the address signal generator means and the first address signal, the address signal generator means being adapted to generate a sequence of address signals in response to the occurrence of said jump control signal, starting with said second address.

13. Transcription apparatus as claimed in claim 12, wherein said block of pointing vectors comprises exactly three pointing vectors, and that said block of pointing vectors further comprises a third address signal, that the address generator means is adapted to issue a second jump control signal upon detection of equality between an address signal supplied by the address signal generator means and the third address signal, the address signal generator means being adapted to generate a sequence of address signals in response to the occurrence of said second jump control signal, starting with the address subsequent to said first address.

14. Transcription apparatus as claimed in claim 13, wherein the memory means is in the form of a removable solid state memory unit and that the transcription device is provided with coupling means for mechanically and electrically cooperating with coupling means of the solid state memory unit.

15. Transcription apparatus as claimed in claim 14, wherein the coupling means are in accordance with an internationally standardized interface.

16. Transcription apparatus as claimed in claim 14, wherein said interface is a PCMCIA interface.

* * * * *